(12) United States Patent
Nakayama et al.

(10) Patent No.: US 6,711,295 B2
(45) Date of Patent: *Mar. 23, 2004

(54) ENCODING APPARATUS AND METHOD, AND STORAGE MEDIUM

(75) Inventors: Tadayoshi Nakayama, Tokyo (JP); Hiroshi Kajiwara, Inagi (JP); Takeshi Yamazaki, Yokohama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/412,431

(22) Filed: Oct. 5, 1999

(65) Prior Publication Data

US 2003/0118242 A1 Jun. 26, 2003

(30) Foreign Application Priority Data

Oct. 6, 1998 (JP) .......................................... 10-284120

(51) Int. Cl.[7] ................................................ G06K 9/36
(52) U.S. Cl. ........................ 382/232; 382/236; 382/239; 375/240.16; 704/500
(58) Field of Search ................................ 382/232, 236, 382/248, 246, 239; 375/240.16; 704/500

(56) References Cited

U.S. PATENT DOCUMENTS

| 5,581,373 A | 12/1996 | Yoshida | 358/476 |
|---|---|---|---|
| 5,801,650 A | 9/1998 | Nakayama | 341/67 |
| 5,818,970 A | 10/1998 | Ishikawa et al. | 382/248 |
| 5,841,381 A | 11/1998 | Nakayama | 341/67 |
| 5,945,930 A | 8/1999 | Kajiwara | 340/50 |
| 5,960,116 A | 9/1999 | Kajiwara | 382/238 |
| 5,986,594 A | 11/1999 | Nakayama et al. | 341/107 |
| 6,028,963 A | 2/2000 | Kajiwara | 382/239 |
| 6,031,938 A | 2/2000 | Kajiwara | 382/239 |
| 6,101,282 A | 8/2000 | Hirabayashi et al. | 382/246 |
| 6,125,348 A * | 9/2000 | Levine | 704/500 |
| 6,233,355 B1 | 5/2001 | Kajiwara | 382/238 |
| 6,272,180 B1 * | 8/2001 | Lei | 375/240.16 |
| 6,310,980 B1 * | 10/2001 | Kajiwara | 382/238 |
| 6,501,859 B1 | 12/2002 | Kajiwara | 382/239 |
| 2002/0102027 A1 | 8/2002 | Miyake et al. | 382/239 |

OTHER PUBLICATIONS

Weinberger et al., "LOCO–I: A Low Complexity, Context–Based, Lossless Image compression Algorithm", IEEE Data Compression Conference, 1996, pp. 140–149.*

* cited by examiner

*Primary Examiner*—Anh Hong Do
(74) *Attorney, Agent, or Firm*—Fitzpatrick, Cella, Harper & Scinto

(57) ABSTRACT

The primary objective of the present invention is the efficient performance of Golomb-Rice encoding. To achieve this objective, an encoding method comprises the steps of receiving image data for each predetermined unit, separately employing K types of k parameters to perform Golomb-Rice coding for the image data for each predetermined unit, and generating K types of Golomb-Rice coded data, holding the K types of Golomb-Rice coded data obtained at the generation step, based on the image data, selecting one of the k parameters for each predetermined unit, and employing the selected k parameter to select and output one of the K types of Golomb-Rice coded data that are being held.

9 Claims, 18 Drawing Sheets

| DIFFERENCE VALUE | QUANTIZING VALUE |
|---|---|
| Th3—255 | 4 |
| Th2—Th3-1 | 3 |
| Th1—Th2-1 | 2 |
| 1—Th1-1 | 1 |
| 0 | 0 |
| -Th1+1—-1 | -1 |
| -Th2+1—-Th1 | -2 |
| -Th3+1—-Th2 | -3 |
| -255—-Th3 | -4 |

FIG. 9

| INTEGER VALUE V / k PARAMETER | 0 | 1 | 2 | 3 | 4 | ... |
|---|---|---|---|---|---|---|
| 0 | 1 | 01 | 001 | 0001 | 00001 | ... |
| 1 | 01 | 11 | 001 | 101 | 0001 | ... |
| 2 | 001 | 011 | 101 | 111 | 0001 | ... |

FIG. 11

| INDEX | RLT |
|---|---|
| 0—3 | 0 |
| 4—7 | 1 |
| 8—11 | 2 |
| 12—15 | 3 |
| 16, 17 | 4 |
| 18, 19 | 5 |
| 20, 21 | 6 |
| 22, 23 | 7 |
| 24 | 8 |
| 25 | 9 |
| 26 | 10 |
| 27 | 11 |
| 28 | 12 |
| 29 | 13 |
| 30 | 14 |
| 31 | 15 |

FIG. 15A

| LL | HL |
|----|----|
| LH | HH |

FIG. 15B

| LL | HL | HL |
|----|----|----|
| LH | HH |    |
| LH |    | HH |

FIG. 15C

| LL | HL3 | HL2 | HL1 |
|----|-----|-----|-----|
| LH3| HH3 |     |     |
| LH2 |    | HH2 |     |
| LH1 |    |     | HH1 |

| FREQUENCY COMPONENT | QUANTIZING STEP Q |
|---|---|
| LL | 1 |
| HL3 | 2 |
| LH3 | 2 |
| HH3 | 2 |
| HL2 | 4 |
| LH2 | 4 |
| HH2 | 4 |
| HL1 | 8 |
| LH1 | 8 |
| HH1 | 8 |

FIG. 18

| FREQUENCY COMPONENT | PARAMETER k |
|---|---|
| LL | 4 |
| HL3 | 2 |
| LH3 | 2 |
| HH3 | 2 |
| HL2 | 0 |
| LH2 | 0 |
| HH2 | 0 |
| HL1 | 0 |
| LH1 | 0 |
| HH1 | 0 |

FIG. 19

| V \ K | 0 | 1 | 2 |
|---|---|---|---|
| 0 | 1 | 10 | 100 |
| 1 | 01 | 11 | 101 |
| 2 | 001 | 010 | 110 |
| 3 | 0001 | 011 | 111 |
| 4 | 00001 | 0010 | 0100 |
| 5 | 000001 | 0011 | 0101 |
| 6 | 0000001 | 00010 | 0110 |
| 7 | 00000001 | 00011 | 0111 |

FIG. 20

| COEFFICIENT VALUE (QUANTIZING VALUE) | 3 | 4 | −2 | −5 | −4 | 0 | 1 | ... |
|---|---|---|---|---|---|---|---|---|
| CODE (+/−) | 1 | 1 | 0 | 0 | 0 | 1 | 1 | |
| FIRST PLANE (MSB) | 1 | 0 | 1 | 0 | 0 | 1 | 1 | |
| SECOND PLANE | 1 | 1 | 1 | 1 | 1 | 0 | 0 | |
| THIRD PLANE | 1 | 0 | 0 | 0 | 0 | 0 | 1 | |
| FOURTH PLANE | ▨ | 0 | ▨ | 1 | 0 | ▨ | ▨ | |
| ⋮ | | | | | | | | |

- CODE PLANE (+/−)
- FIRST PLANE (MSB)
- SECOND PLANE

ENCODING APPARATUS AND METHOD, AND STORAGE MEDIUM

BACKGROUND OF THE INVENTION

1. Field of the Invention

The present invention relates to an encoding apparatus and method for encoding image data, and to a storage medium on which this method is stored.

2. Related Background Art

Recently, there has been an increase in the number of applications for compressing static images as image data and for externally transmitting the compressed image data, or for storing it in a memory. For these purposes, it is preferable that lossless compression and encoding be used, especially when the data is for static images used for medical purposes, so that no deterioration of image quality occurs.

Accordingly, various efficient lossless compression and encoding methods have been proposed. For example, a compression and encoding method has been proposed for outputting a difference between a pixel to be encoded and a predicted value generated by using peripheral pixels, and for performing Golomb-Rice coding for this difference.

Furthermore, the Golomb-Rice coding can be applied as a part of a lossy encoding method for a multi-valued static image, so that satisfactory coding efficiency can be maintained and there is no deterioration of image quality.

However, how efficient these proposed compression and encoding methods will be is questionable, and a demand exists for a more efficient compression and encoding method.

SUMMARY OF THE INVENTION

To resolve the conventional problem, it is one objective of the present invention to perform Golomb-Rice coding efficiently.

To achieve the above objective, an encoding apparatus according to the present invention has the features specified in the following entries. The encoding apparatus comprises:

an input unit (corresponding to an input unit 100 or 1101 in the preferred embodiments) for inputting image data for each predetermined unit;

a generation unit (corresponding to a Golomb-Rice encoding circuit 104 or 1106) for performing Golomb-Rice coding for the image data for each predetermined unit (corresponding to one pixel or one sub-block), and for generating K types of Golomb-Rice coded data by separately employing K types of k parameters;

a holding unit (corresponding to coded data selector 104' or 1106') for holding the K types of Golomb-Rice coded data obtained by the generation unit; and a determination unit (corresponding to prediction converting circuit 102 or 1105) for, based on the image data, determining one of the k parameters for each predetermined unit, wherein the holding unit employs the selected k parameter to select and output one of the held K types of Golomb-Rice coded data.

The other objectives and features of the present invention will become apparent during the course of the explanation for the following embodiments, given while referring to the accompanying drawings.

BRIEF DESCRIPTION OF THE DRAWINGS

FIG. 9 is a diagram showing example Golomb-Rice code using k parameters of 0, 1 and 2;

FIG. 11 is a diagram showing RLT values relative to index values in run-length coding;

FIGS. 15A, 15B and 15C are diagrams for explaining band divisions performed by using a two-dimensional wavelet transform;

FIG. 18 is a diagram for explaining frequency bands and corresponding coding parameters;

FIG. 19 is a diagram for explaining quantizing coefficients and corresponding coding parameters;

FIG. 20 is diagram for explaining quantizing coefficients and bit planes;

FIG. 21 is a diagram showing an example code string that is to be output by a bit plane order scanning unit;

DETAILED DESCRIPTION OF THE PREFERRED EMBODIMENTS (First Embodiment)

A detailed explanation will now be described while referring to a first embodiment of the present invention.

Figure 1:
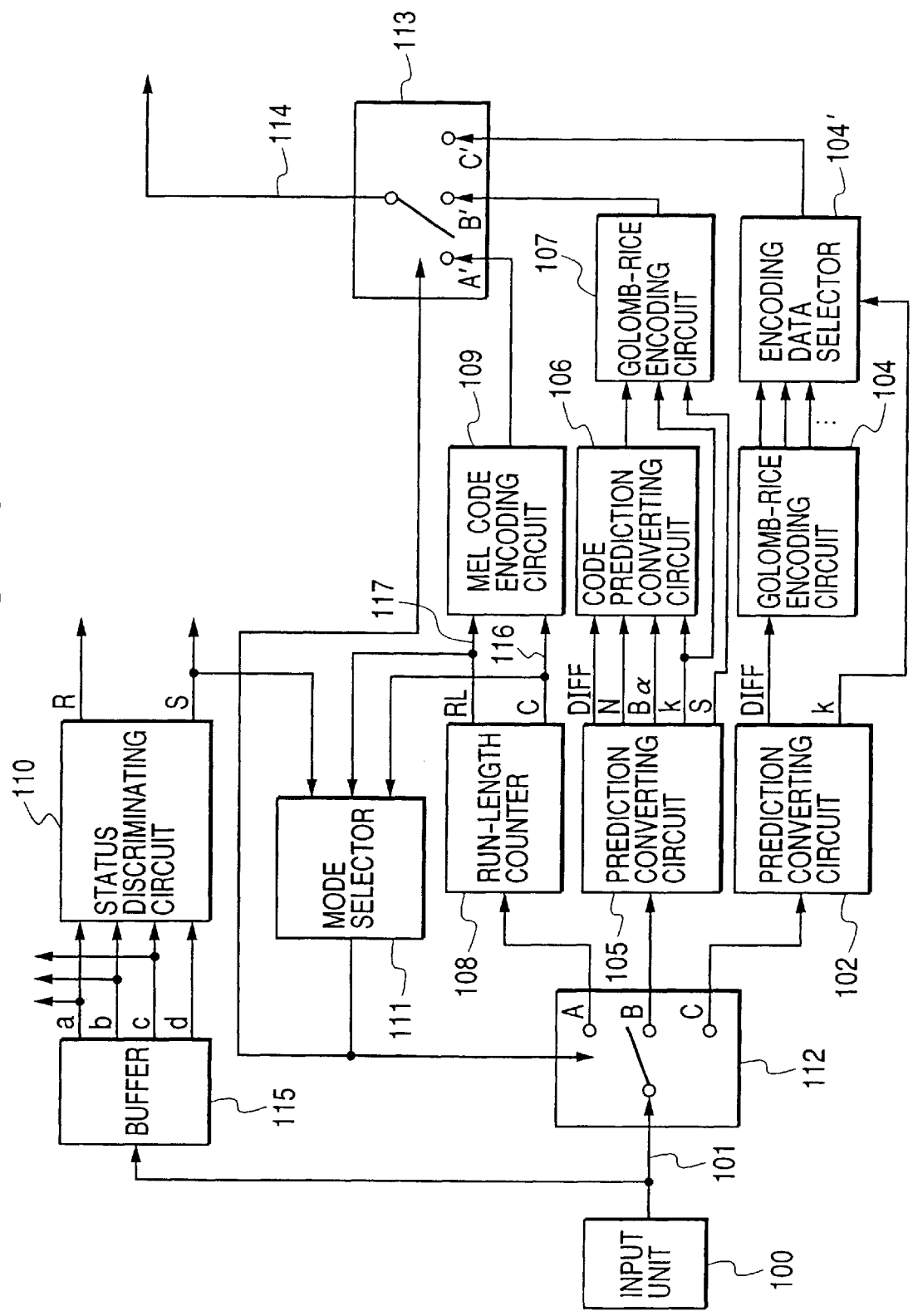
FIG. 1 is a block diagram for a first embodiment of the present invention.

FIG. 1 is a block diagram for carrying out the first embodiment of the present invention. An input unit 100 in FIG. 1 is a device provided for receiving image data.

Also provided are signal lines 101 and 114, along which image data are transmitted to succeeding stages; prediction converting circuits 102 and 105; Golomb-Rice coding circuits 104 and 107; a coded data selector 104'; a sign prediction converting circuit 106; a run-length counter 108; a Melcode encoding circuit 109; a status discriminating circuit 110; a mode selector 111; switches 112 and 113; and a buffer for storing image data for two lines.

In this embodiment, encoding is performed by changing three coding modes. Specifically, the first mode is a normal mode wherein the prediction converting circuit 102 and the Golomb-Rice coding circuit 104 perform an encoding process; the second mode is a run-length mode wherein the run-length counter 108 and the Melcode encoding circuit 109 perform an encoding process; and the third mode is a run end mode wherein the prediction converting circuit 105, the sign prediction converting circuit 106 and the Golomb-Rice encoding circuit 107 perform an encoding process.

The operations of the individual sections in this embodiment will now be described by employing an encoding example for a monochrome image signal when eight bits are used for one pixel (a value of 0 to 255). It should be noted, however, that the present invention is not limited to this example, and can also be applied for the encoding performed for a multi-valued color image that is composed of RGB color components of 8 bits each, or Lab luminance and chromaticity components of 8 bits each. Each component need only be encoded in the same manner as that used for the monochrome image signal.

The encoding of each component can be changed for each screen, and the decoding side can confirm the condition of the overall image at an early stage. The encoding of each component can be changed for each pixel, each line or each band formed using a plurality of lines, and early monitoring of a partially completed color image is possible.

All the internal values of the buffer 115 are initially set to 0.

A pixel to be encoded (hereinafter referred to as an object pixel) is input by the input unit 100 in the order used for raster scanning, and is transmitted along the signal line 101 to the switch 112 and to the buffer 115.

The image data are sequentially transmitted to the buffer 115 and are held for two lines. These two lines consist of a line in which the object pixel is present and the preceding line that was input.

The status discriminating unit 110 generates a status number S, which represents the status of peripheral pixels of the object pixel, and a phase flag R, which is used to identify the phases of the pixels. First, the status discriminating unit 110 reads, from the buffer 115, image data that correspond to peripheral pixels a, b, c and d of the object pixel.

Figures 2, 3:
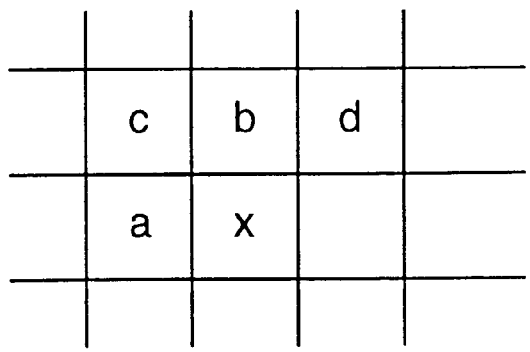
FIG. 2 is a diagram showing the positional relationship between a pixel to be encoded and peripheral pixels.
FIG. 3 is a diagram showing a method for quantizing a difference among peripheral pixels.

FIG. 2 is a diagram showing the positional relationship of the object pixel and its peripheral pixels a, b, c and d. In FIG. 2, the peripheral pixels a, b, c and d are those relative to the object pixel that have already been encoded. The pairs d-b, b-c and c-a are obtained by using the image data a, b, c and d that have been read. In accordance with the data correlation steps shown in FIG. 3, these values are quantized to provide values at nine levels, −4, −3, −2, −1, 0, 1, 2, 3 and 4, and to obtain quantized values q(d-b), q(b-c) and q(c-a).

The status number S, which represents the status of a peripheral pixel, is generated using the calculation formula q(d-b)×81+q(b-c)×9+q(c-a). Then, the sign of the status number S is examined to determine whether it is positive or negative. When the sign is positive, the phase flag R is set to 0, and when the sign is negative, the phase flag R is set to 1 and the value of the status number S is converted to a positive value. Through this processing, status numbers, of from 0 to 365, and the phase flag R, which indicates a value of 0 or 1, are generated and output.

The mode selector 111 selects an encoding mode and changes the switches 112 and 113 by using the status number S, obtained by using the status discriminating circuit 110 and a run length RL and an encoding control signal Q that are generated by the run-length counter 108. The initial value of the run-length RL of the run-length counter 108 is 0.

Figure 8:
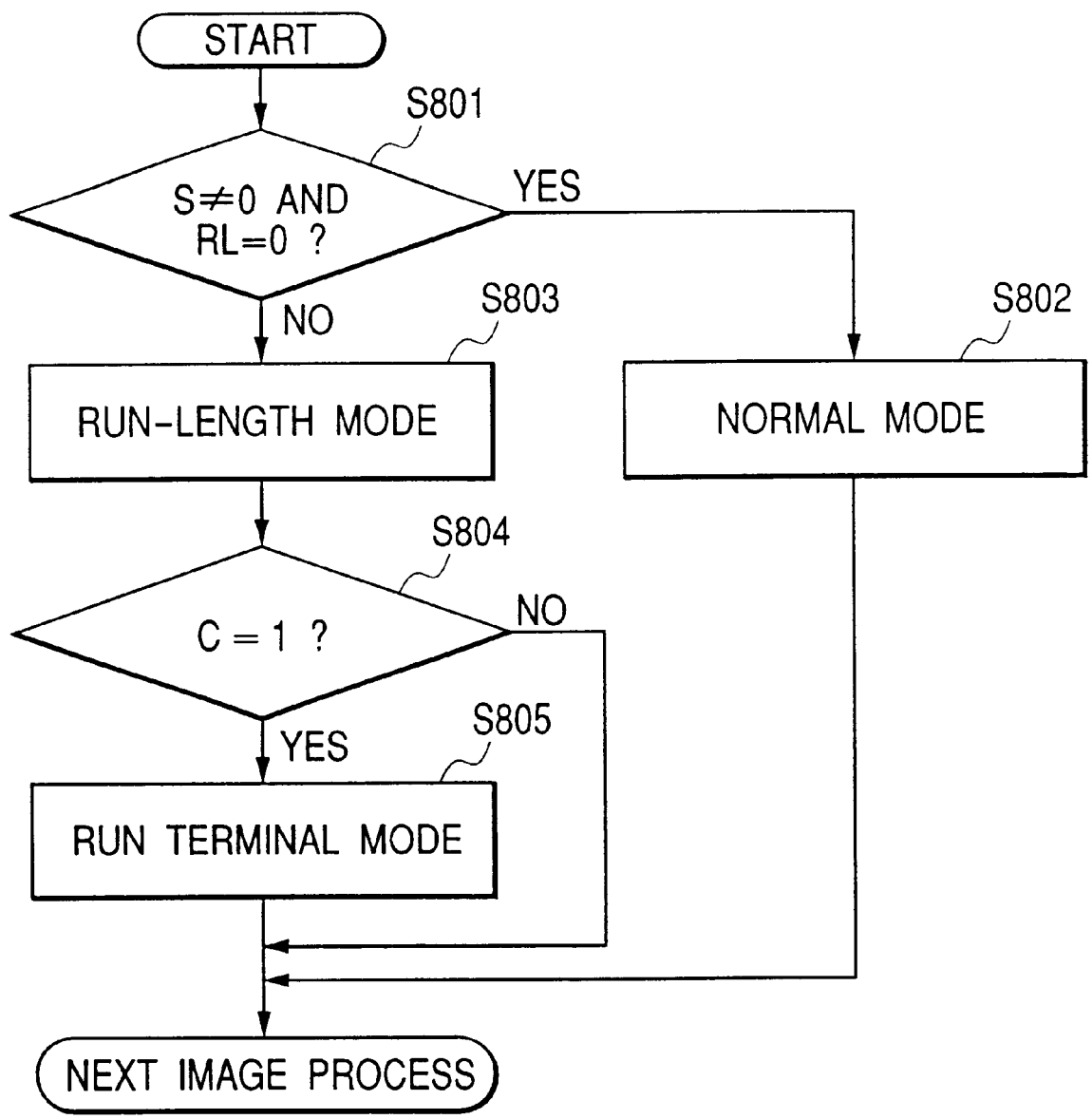
FIG. 8 is a flowchart showing the control provided for a coding mode by a mode selector.

FIG. 8 is a flowchart showing the overall code mode control process performed by the mode selector 111 for one of the pixels that is to be encoded. The detailed processing performed for each step will be described later.

First, at STEP 801, the mode selector 111 receives the status number S and the run-length RL for an object pixel to be encoded. When S≠0 and RL=0, program control moves to STEP 802. For the other cases, program control goes to STEP 803.

At STEP 802, the switch 112 is connected to terminal C and the switch 113 is connected to terminal C' to perform encoding in the normal mode. At STEP 803, the switch 112 is connected to terminal A and the switch 113 is connected to terminal A' to perform encoding in the run-length mode, i.e., to encode the run-length. During the encoding processing in the run-length mode, which will be described in detail later, each pixel not actually encoded and output, but when the run-length has been established, i.e., when the end of the string of like sequential pixel values is reached, these pixels are encoded and output. In this case, the value of the encoding control signal c is changed from 0 to 1.

Following STEP 803, the value of the encoding control signal c is examined at STEP 804. When c=1, program control advances to STEP 805. At STEP 805, the switch 112 is connected to terminal B and the switch 113 is connected to terminal B' to perform encoding in the run end mode. The above described processing is repeated for each pixel, and one of the three encoding modes is selected for encoding.

The reason for changing the three encoding modes, i.e., the roles of the three encoding modes, will be briefly explained.

The normal mode is applied for encoding a pixel for which it is predicted that a prediction difference obtained by predictive conversion will indicate a Laplace distribution. It should be noted that when it is expected that a run at the same luminance will be continued (peripheral pixels have the same luminance level), the normal mode is changed to the run-length mode to further increase the coding efficiency.

The run-length mode is employed when it is expected that a run having the same luminance level will be continued, and instead of a prediction difference, the run-length of the pixel value is encoded (run-length coding). Therefore, while in the normal mode (in which Huffman coding or Golomb-Rice coding is employed for a prediction difference) one sample of one bit or smaller can not be encoded, in the run-length mode one sample of one bit or smaller can be encoded, and coding efficiency can be improved.

The run terminal mode is a mode for encoding an object pixel when the run at the same luminance level is terminated. Since the value of a pixel to be encoded is the final terminal of the run-length for run-length coding, it differs from the preceding pixel value. Therefore, when the preceding pixel value is regarded as a predicted value, as in the normal mode, the condition is so special that a prediction difference of 0 does not occur and the encoding efficiency is not improved.

While taking this situation into account, rather than the normal mode, the run terminal mode is employed to encode the pixel for which the run-length mode has been completed, i.e., the object pixel whose value relative to the value of the preceding pixel has been changed. Further, when predictive encoding is to be performed for the object pixel in the above condition, the distribution of the prediction differences tends to be discrete, and is predicted to be far from being the Laplace distribution. In this condition, since the predicted value correction that will be described later for use in the normal mode is not very effective, encoding is performed without using the prediction difference. It should be noted that it is highly probable that the coding efficiency will be preferable for the next pixel to be encoded when its preceding pixel value is employed as a predicted value.

The individual three encoding modes will now be explained.

First, an explanation will be given for the encoding process in the normal mode performed by the prediction converting circuit 102, the Golomb-Rice encoding circuit 104 and the coded data selector 104'.

The prediction converting circuit 102 predicts the value of an object pixel by using those for peripheral pixels a, b and c of the object pixel, and generates a difference (prediction difference) Diff between a predicted value obtained by the prediction and the actual value of the object pixel, and a k parameter that will be described later.

Figure 4:
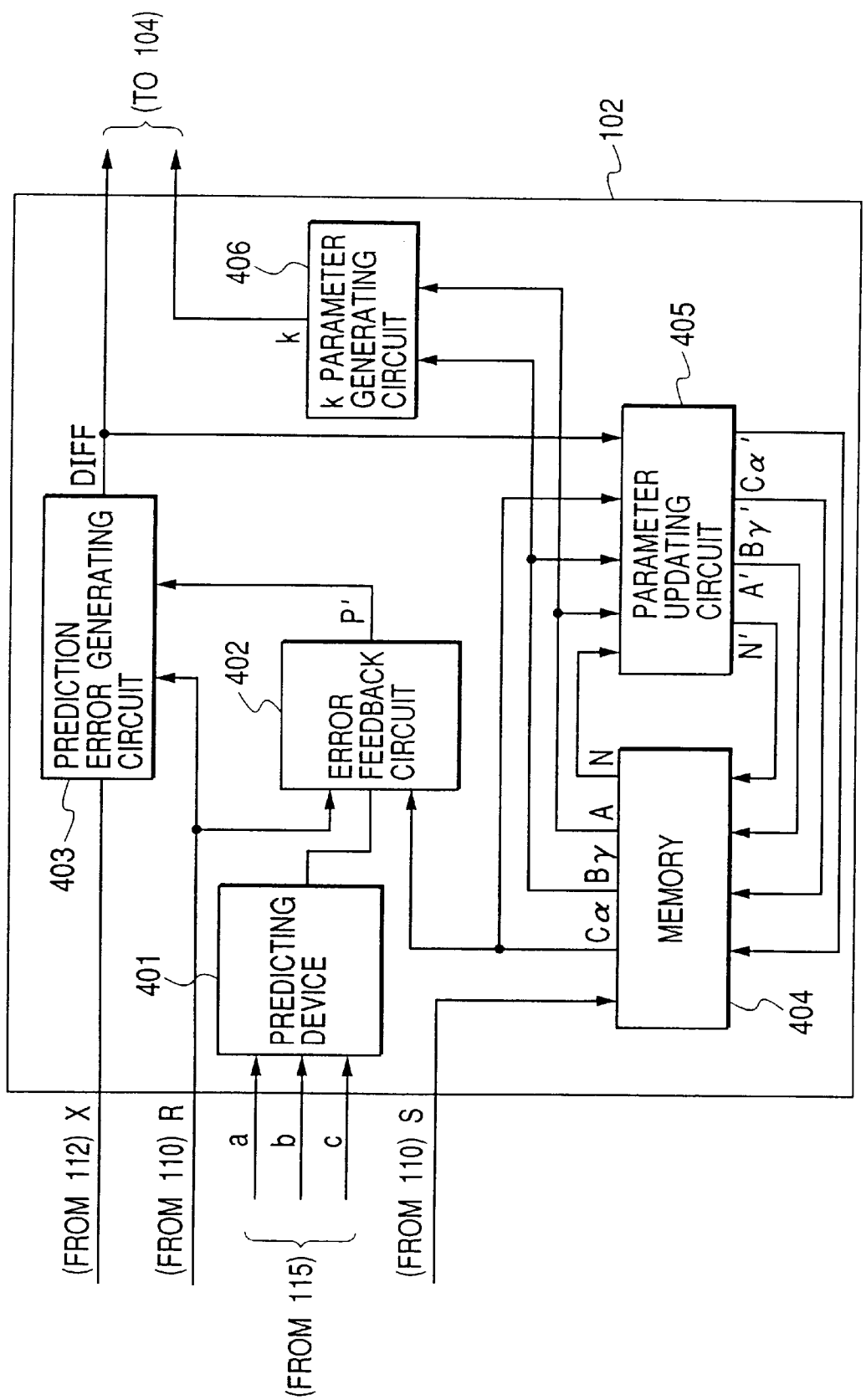
FIG. 4 is a diagram illustrating the arrangement of a prediction converting circuit.

FIG. 4 is a diagram showing the internal arrangement of the prediction converting circuit 102.

In FIG. 4, the prediction converting circuit 102 comprises: a predicting device 401, an error feedback circuit 402, a prediction error generating circuit 403, a memory 404, a parameter updating circuit 405, and a k parameter generating circuit 406.

Although not shown in FIG. 1, the prediction converting circuit 102 receives pixel value data for the peripheral pixels a, b and c from the buffer 115, and the status number S and the phase flag R from the status discriminating circuit 110. Further, the pixel value x of the object pixel is received from the terminal C of the switch 112.

Four parameters, N, A, Bγ and Cα, are stored in the memory 404 for the individual status numbers S. These values are initialized at the beginning of encoding as: N=1, A=4 and Bγ=Cα=0.

The parameter N is the number of times to generate the status S, the parameter A is the sum of the absolute values of the prediction errors in the status S, the parameter Bγ is the sum of the prediction errors in the status S, and Cα is a correction value used to correct the predicted value.

The processing performed by the prediction converting circuit 102 will now be described while referring to FIG. 4. First, the predicting device 401 obtains, from the buffer 115, pixel values of the peripheral pixels a, b and c (see FIG. 2 for the positional relationship) of the object pixel to be encoded. A prediction value P is generated based on the pixel values a, b and c. The prediction value P is obtained by the following equation.

$$P = \begin{cases} \max(a, b): \text{ when } \min(a, b) > c \\ \min(a, b): \text{ when } \max(a, b) < c \\ a + b - c: \text{ for a case other than the above cases} \end{cases}$$

The error feedback circuit 402 corrects the prediction value P by using a prediction correction value Cα in the status S that is transmitted to the memory 404, which will be described later, and generates a corrected prediction value P'. Specifically, when the phase flag R received from the status discriminating circuit 110 indicates 0, P'=P+Cα, while when the phase flag R indicates 1, P'=P−Cα. Further, when P' is smaller than 0, P'=0, and when P' is equal to or greater than 255, P'=255.

The prediction error generating circuit 403 calculates a difference between the pixel value x of the object pixel and the corrected prediction value P', and generates a prediction difference Diff. When the phase flag R indicates 0, Diff=x−P', while when the phase flag R indicates 1, Diff=P'−x.

The prediction error generating circuit 403 adds 255 to the difference Diff when Diff is smaller than −128, or subtracts 255 from the difference Diff when Diff is equal to or greater than 128, so that the value of the difference Diff can be represented within the range of −128 to 127.

The k parameter generating circuit 406 receives the times N of generation of the status S, and the value A obtained by adding absolute values of prediction differences in the status S. Then, in accordance with min(k|N×2$^k$≧A), the k parameter generating circuit 406 obtains the value of the k parameter that is used for Golomb-Rice encoding. Here, min(a|b) means the minimum a that satisfies the condition b.

The parameter updating circuit 405 reads the four parameters N, A, Bγ and Cα in the status S, and updates them to N', A', Bγ' and Cα'. Specifically, A'=A+|Diff| and Bγ'=Bγ+Diff are calculated to obtain A' and Bγ'.

When the value N is equal to threshold value Th1, the values of N, A and Bγ are multiplied by ½. The threshold value Th1 is used to limit the parameters N, A and Bγ within a specific range, and is designated in advance (e.g., Th1=64). Then, N is updated by calculating N'=N+1.

Figure 12:
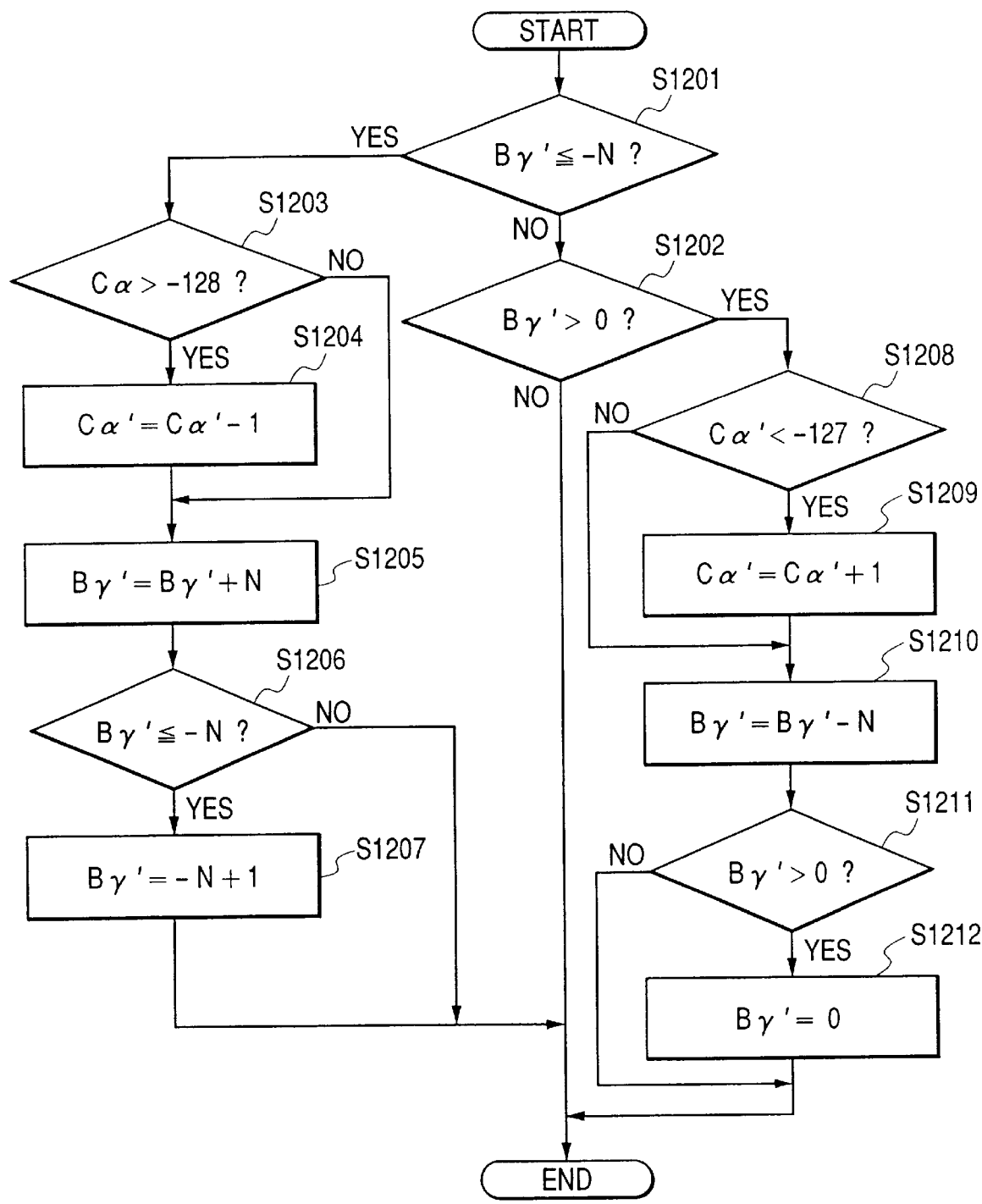
FIG. 12 is a flowchart showing the processing for updating prediction correction value C.

FIG. 12 is a flowchart showing the processing for updating the prediction correction value Cα. When the value of Cα is substituted into Cα', at STEP 1201 a check is performed to determine whether the parameter Bγ' is equal to or smaller than −N. When the value Bγ' is equal to or smaller than −N, program control advances to STEP 1203. If the value Bγ' is greater than −N, program control moves to STEP 1202.

At STEP 1203, the value of Cα' is compared with −128. When the value Cα' is greater than 0128, Cα' is decremented by 1 (STEP 1204).

Then, the value N is added to Bγ' (STEP 1205). When the value Bγ' is equal to or smaller than −N, Bγ' is set as Bγ'=−N+1 (STEP 1206 and STEP 1207).

At STEP 1202, Bγ' is compared with 0. When Bγ' is equal to or greater than 0, program control goes to STEP 1208. When Bγ' is smaller than 0, the updating processing is terminated.

At STEP 1208, Cα' is compared with 127. When Cα' is smaller than 127, Cα' is incremented by 1 (STEP 1209). Then, N is subtracted from Bγ' (STEP 1210). When Bγ' is equal to or greater than 0, Bγ' is set as Bγ'=0 (STEP 1211 and STEP 1212).

The finally obtained parameters N', A', Bγ' and Cα' are output to the memory 404, and the four parameters N, A, Bγ and Cα in the status S, which are stored in the memory 404, are replaced with the new ones.

Through this processing, the prediction converting circuit 102 generates the prediction difference Diff and the k parameter, and outputs them to the Golomb-Rice encoding circuit 104 at the succeeding stage.

The encoding process performed by the Golomb-Rice encoding circuit 104 will now be described. In this invention, in order to perform the fast Golomb-Rice coding, before the k parameter is received from the k parameter generating circuit 406 at the preceding stage, the Golomb-Rice encoding circuit 104 stores Golomb-Rice coded data that correspond to individual k parameters the number (e.g., K parameters of k=0, 1, . . . and K−1) of which is set in advance based only on the difference Diff that corresponds to the object pixel x. Each time the k parameter is determined to be actually applied for each object pixel, the Golomb-Rice encoding circuit 104 selects and outputs only Golomb-Rice coded data that corresponds to the determined k parameter. Therefor, the overall encoding can be performed fast. Specifically, since the difference Diff and the k parameter are required for Golomb-Rice coding in the normal mode, only the difference Diff that can be obtained at a comparatively early time is employed to generate, in advance, K sets of Golomb-Rice coded data that are to be finally output.

An explanation will now be given for the processing for generating one set of Golomb-Rice coded data by using one k parameter.

First, the Golomb-Rice encoding circuit 104 employs the following equation to convert, into a non-negative integer value V, the prediction difference Diff that is output by the predication converting circuit 102.

$$V = \begin{vmatrix} -2 \times Diff - 1 \text{: when } Diff < 0 \\ 2 \times Diff \text{: when } Diff \geq 0 \end{vmatrix}$$

Then, Golomb-Rice coding is performed for the integer value V based on the k parameter. An explanation will now be given for the Golomb-Rice encoding of the non-negative integer value V based on the k parameter.

First, the non-negative integer V is changed to a binary expression. Then, the binary value is divided into a lower k bit portion and an upper bit portion. Then, bits of 0, the number of which is equivalent to the count obtained when the upper bit portions are represented in the decimal system, is added to the lower k bit portions, and finally, a bit of 1 is added to obtain a coded word.

This processing will be described by using a specific example. When k=2 and V=13, binary expression "1101" of V is generated, and the lower two bits "01" are defined as Golomb-Rice coded data for the first and the second bits. Three 0s ("000") that are employed to represent the remaining upper two bits in the decimal system are defined as the Golomb-Rice coded data for the third to the fifth bits. Then, the bit of "1" is added as Golomb-Rice coded data. The finally obtained Golomb-Rice coded data is "010001".

FIG. 9 is a table showing non-negative integers and corresponding coded words when the k parameter=0, 1 and 2 to perform the above encoding processing.

K sets of Golomb-Rice coded data are generated by the Golomb-Rice encoding circuit 104 so as to correspond to individual k parameters, and are temporarily stored in the coded data selector 104'.

It should be noted that the Golomb-Rice encoding circuit 104 performs Golomb-Rice encoding for a difference Diff for the same pixel by a plurality of times. To increase the processing speed, in this embodiment, an encoding apparatus is incorporated to perform parallel Golomb-Rice encoding of the difference Diff for the same pixel in accordance with a plurality of k parameters (e.g., k=0, 1, . . . and K−1).

At the same time as the coded data selector 104' receives the k parameter that correspond to the original data Diff of the K sets of Golomb-Rice coded data, the selector 104' selects only coded data that corresponds to the k parameter, and outputs the data to the terminal C' of the switch 113'.

An explanation will now be given for the run-terminal mode in which the prediction converting circuit 105, the sign prediction converting circuit 106 and the Golomb-Rice encoding circuit 107 perform encoding.

Figure 5:
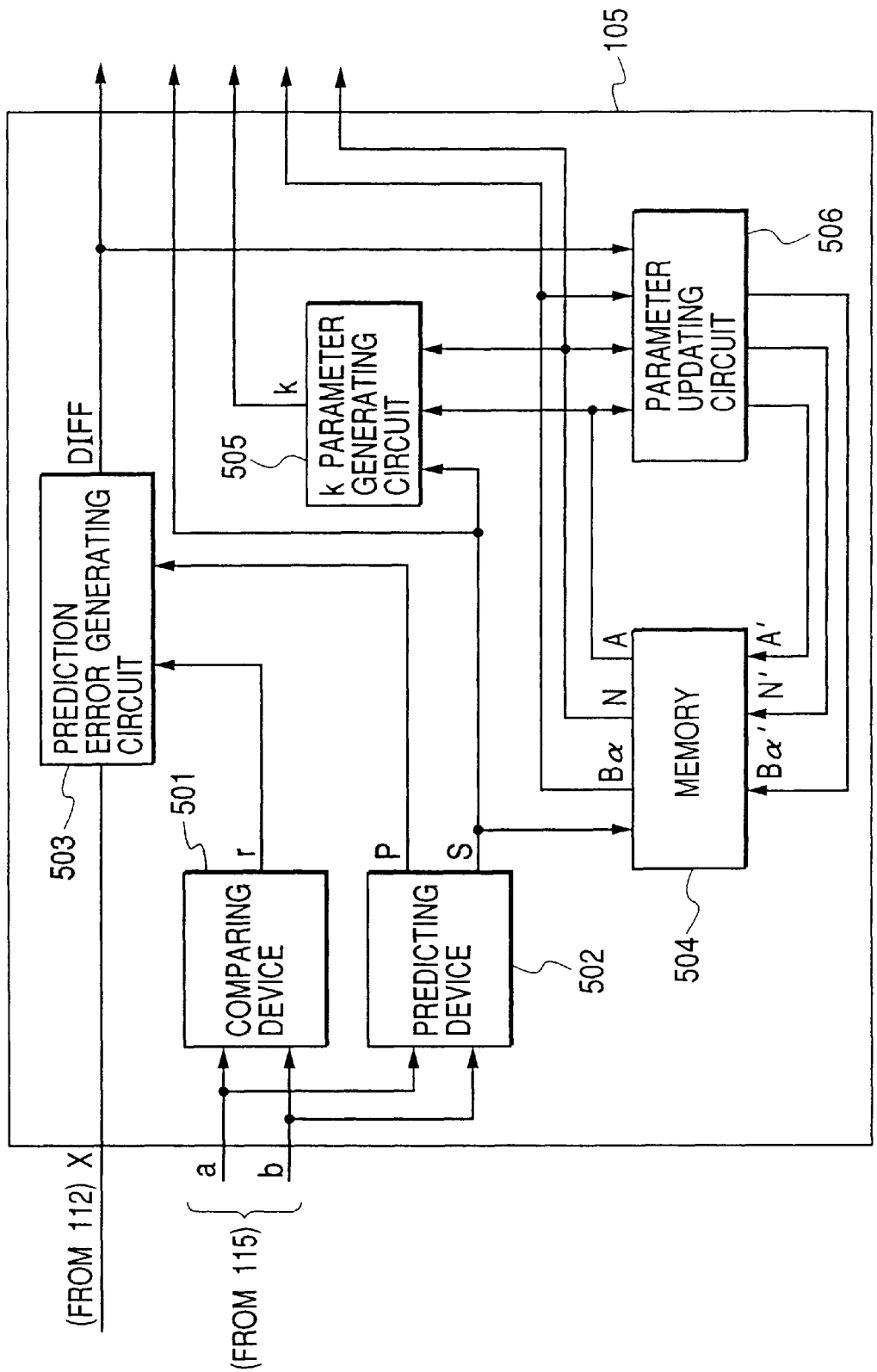
FIG. 5 is a diagram illustrating the arrangement of another prediction converting circuit.

The prediction converting circuit 105 employs the peripheral pixel values a and b to predict a value of an object pixel, and produces a prediction difference. FIG. 5 is a diagram showing the arrangement of the predication converting circuit 105.

In FIG. 5, the prediction converting circuit 105 includes a comparing device 501, a predicting device 502, a prediction error generating circuit 503, a memory 504, a k parameter generating circuit 505 and a parameter updating circuit 506. Further, though not shown in FIG. 1, the pixel values of the peripheral pixels a and b are transmitted from the buffer 115 to the prediction converting circuit 105. The pixel value x of the object pixel is transmitted from the terminal B of the switch 112.

Three parameters N, A and Bα are stored in the memory 504, and correspond to the individual states specified by the status number S. At the start of the image encoding, the parameters N, A and Bα are initialized to N=1, A=4 and Bα=0. It should be noted that N denotes the number of times for generating the status S, A denotes the sum of absolute values of prediction differences in the status S, and Bα denotes the number of times where a negative prediction difference appears in the status S.

The operation by the prediction converting circuit 105 will be described in detail while referring to FIG. 5. First, the comparing device 501 receives, from the buffer 115, the peripheral pixels a and b of the object pixel, and compares these values. When b>a, a value of 1 is output, while when b≦a, a value of 0 is output. The value output from the comparing device 501 is hereinafter referred to as a phase flag r (1 or 0).

The predicting device 502 employs the peripheral pixels a and b to generate a prediction value P and a status number S. when a=b, the value of the status number S is 1, while a≠b, the value is 0. The prediction value P is constantly b.

The prediction error generating circuit 503 employs the object pixel value x and the prediction value P to produce a prediction difference Diff. When the phase flag r is 0, Diff=x−P, and when the phase flag r is 1, Diff=P−x.

The k parameter generating circuit 505 reads the status S, the number of times N of generation of the status S, and the sum A of the absolute values of prediction differences in the status S, and calculates T by using the following equation.

$$T = \begin{vmatrix} A \text{: when } S = 0 \\ A + N/2 \text{: when } S = 1. \end{vmatrix}$$

In accordance with min(k|N×2$^k$≧T), the value of the k parameter used during Golomb-Rice encoding is obtained and output.

In consonance with the timing whereat the Golomb-Rice coding is performed for the object pixel, the parameter updating circuit 506 reads, from the memory 504, the three parameters N, A and Bα in the status S, and updates them to obtain N', A' and Bα'. First, A' is obtained by calculating A'=A+|Diff|. Then, whether the difference Diff is positive or negative is examined. When the difference Diff is positive, Bα'=Bα, and when the difference Diff is negative, Bα'=Bα+ 1. In other words, Bα indicates the number of times whereat the prediction difference Diff is negative. N' is obtained by calculating N'=N+1.

The thus obtained N', A' and Bα' are output to the memory 504, and are written as the three parameters N, A and Bα in the status S before the Golomb-Rice encoding for the next object pixel is begun.

Through the above described processing, the prediction converting circuit 105 outputs the prediction difference Diff, the k parameter, the status number S, and the two parameters Bα and N in the status S.

When the k parameter is 0, the sign prediction converting circuit 106 employs the values of Bα and N to predict the sign (+ or −) of the prediction difference Diff, and changes the sign of Diff based on the prediction results.

Figure 6:
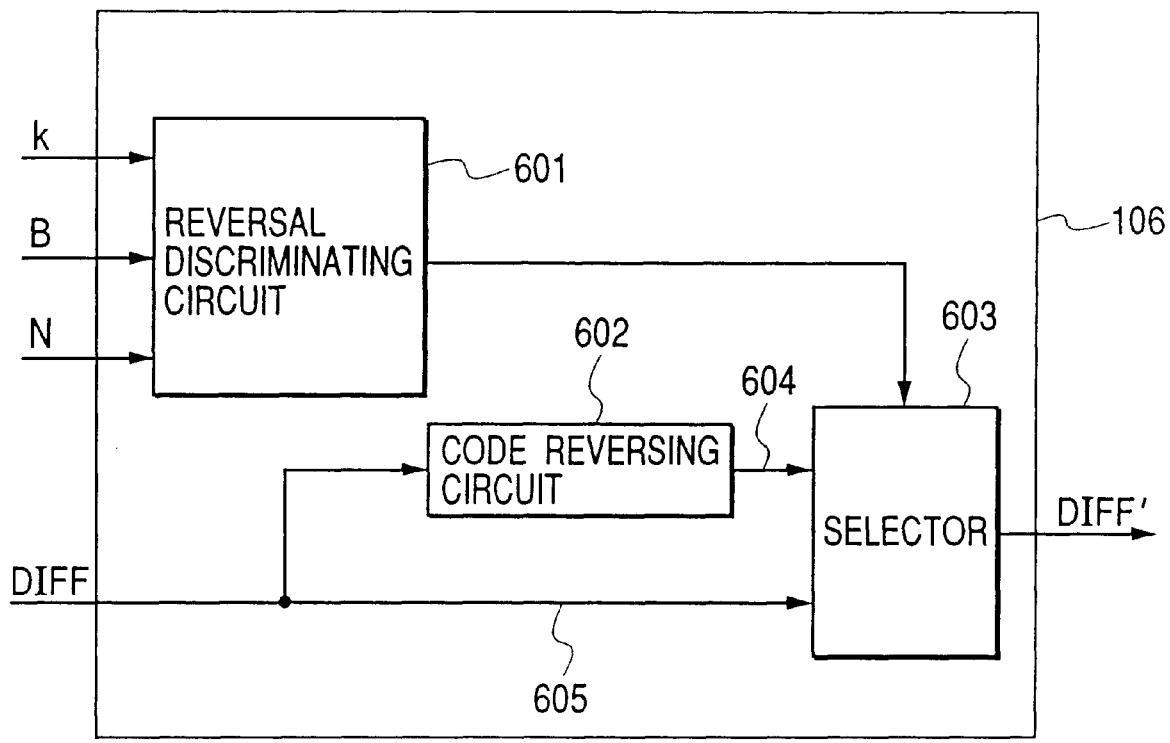
FIG. 6 is a diagram illustrating the arrangement of a code prediction converting circuit.

FIG. 6 is a diagram showing the arrangement of the sign prediction converting circuit 106. The prediction converting circuit 106 comprises a reversal discriminating circuit 601, a sign reversing circuit 602 and a selector 603.

The operation by the sign prediction converting circuit 106 will now be described in detail while referring to FIG.

6. First, when k=0 and Bα>N/2, the reversal discriminating circuit 601 outputs a signal of "1" to instruct sign inversion. For the other cases, the circuit 601 outputs a signal of "0" to instruct no sign inversion.

Upon receipt of the instruction signal (1 or 0), the sign reversing circuit 602 inverts the sign (+ or −) of the difference Diff that corresponds to the object pixel, and outputs −Diff to the signal line 604.

When the value output by the sign reversing circuit 602 is 0, the selector 603 selects the Diff received from the signal line 605, and outputs it. When the value is "1", the selector 603 outputs −Diff that is the output value of the sign reversing circuit 602.

Through this processing, the sign prediction converting circuit 106 selects Diff or −Diff relative to the received value Diff, and outputs it.

Figure 13:
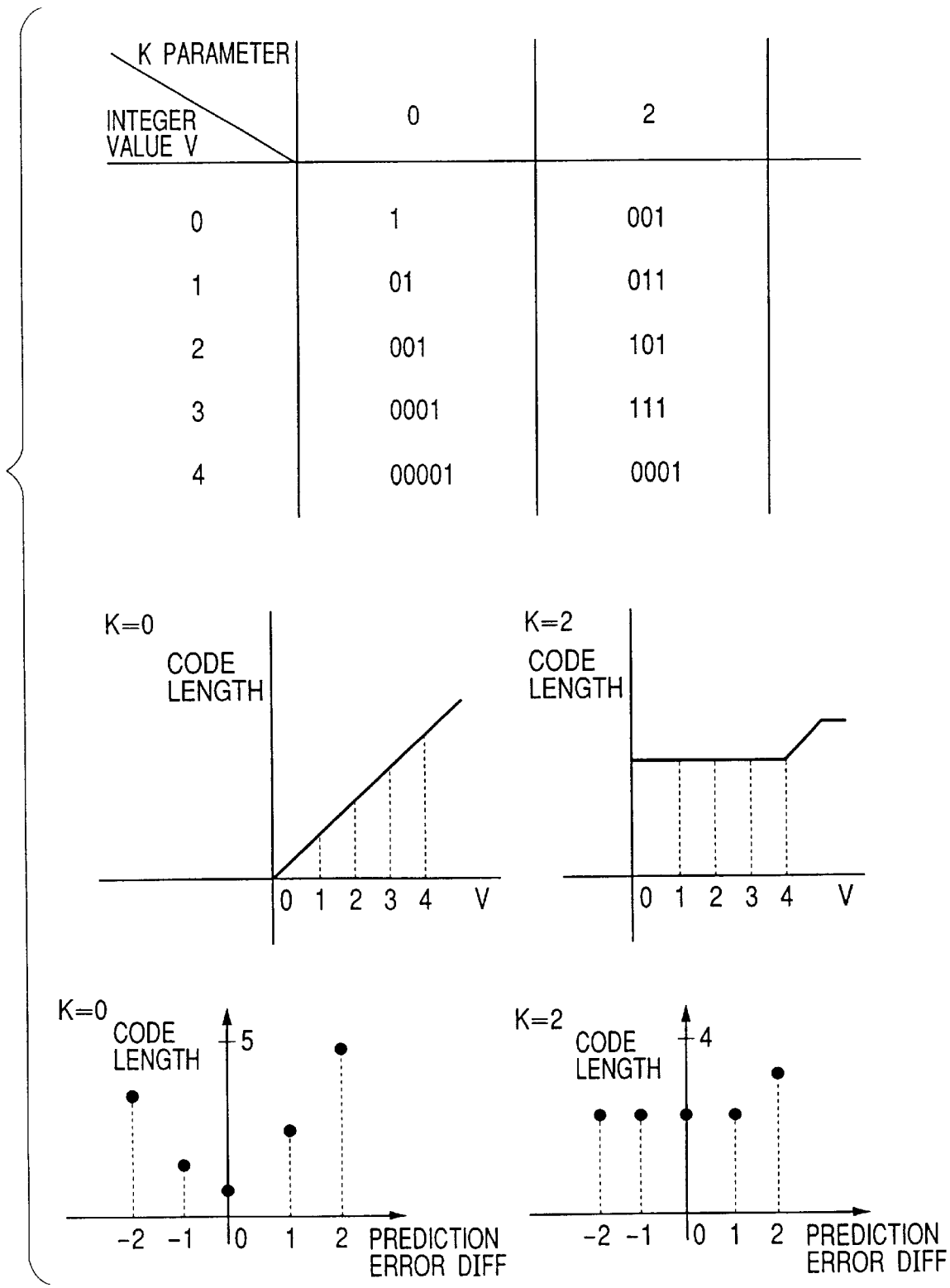
FIG. 13 is a diagram showing the assignment of Golomb-Rice code when a k parameter is 0 or 2.

The role of the sign inversion will be briefly described. FIG. 13 is a diagram showing the assignment of Golomb-Rice code when the k parameter is 0 and when the k parameter is 2. In FIG. 13, the case where the k parameter is 0 means a case where the values of the peripheral pixels including the object pixel are less fluctuated. Therefore, the relationship shown in FIG. 13 is established for the integer value V used in the Golomb-Rice encoding, the output code and the code length.

When the k parameter is 2, the values of the peripheral pixels including the object pixel are fluctuated more greatly than when the k parameter is 0. Thus, in order to perform appropriate encoding, the relationship shown in FIG. 13 is established between the integer value V or the prediction difference Diff during the Golomb-Rice encoding, and the output code and the code length.

When the k parameter is 0, the code length differs although the prediction differences Diff have the same absolute value. Whereas, when the k parameter is other than 0 (e.g., 2), the code length is the same when the prediction differences Diff have the same absolute value.

While taking this coding characteristic into account, sign inversion is performed only when the k parameter is 0 and when Bα>N/2 (when the number of times where the prediction difference in the status S is negative is more than half). As a result, the prediction difference Diff (e.g., −1 or 1) that has the same absolute value and that is produced more frequently can be determined as output code that has a shorter code length.

That is, when difference of −1 is frequently produced, the sign prediction converting circuit 106 does not need to perform sign inversion, and when −1 is less frequently produced (1 is more frequently produced), encoding is performed while −1 is translated as 1, so that the coding efficiency can be improved.

The above sign inversion process can be performed when the k parameter is other than 0. However, in this embodiment, the sign inversion process for such a case is not performed because it is not very effective.

The sign inversion process is changed as needed while the image data are being encoded. Since the decoding side also includes the processors that correspond to the reversal discriminating circuit 601 and the sign reversing circuit 602 for the decoded peripheral pixels, the decoding side can specify an object pixel for which the interpretation as to whether the prediction difference Diff is positive or negative was changed.

When the sign inversion process has been completed, the Golomb-Rice encoding circuit 107 employs the k parameter to perform Golomb-Rice coding for a prediction difference Diff received from the sign prediction converting circuit 106. The Golomb-Rice encoding circuit 107 then outputs the coded data to the terminal B' of the switch 113. To do this, first, the difference Diff is changed into a non-negative integer value V by using the following equation.

$$V = |-2 \times (Diff - S) - 1|: \text{when } Diff < 0$$

$$|2 \times (Diff - S)|: \text{when } Diff \neq 0$$

Then, the Golomb-Rice encoding is performed for the non-negative integer value V using the k parameter. The Golomb-Rice encoding processing is the same as that as explained for the Golomb-Rice encoding circuit 104.

An explanation will now be given for the run-length mode in which the run-length counter 108 and the Melcode encoding circuit 109 perform the encoding process.

The run-length counter 108 receives the object pixel value x from the Melcode encoding circuit 109, and the preceding pixel value a from the buffer 115, and outputs coding control signal c to the signal line 116, and the number RL of continuous, same luminance values to the signal line 117.

Figure 7:
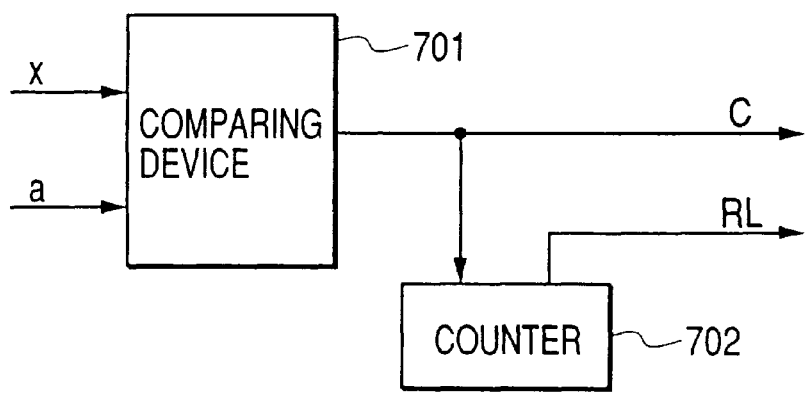
FIG. 7 is a diagram illustrating the arrangement of a run-length counter.

FIG. 7 is a diagram illustrating the arrangement of the run-length counter 108.

The run-length counter 108 comprises a comparing device 701 and a counter 702. The comparing device 701 compares the value of the object pixel x with the value of the preceding pixel a. When the two values are equal, a value of "1" is output as the coding control signal c, and when the two values are not equal, a value of "0" is output. The counter 702 stores the number RL of the continuous, same luminance values. When the coding control signal of "1" is output from the comparing device 701, the value RL is incremented and the resultant RL is output. When the coding control signal is "0", the value is RL is output unchanged, and is thereafter reset.

Figure 10:
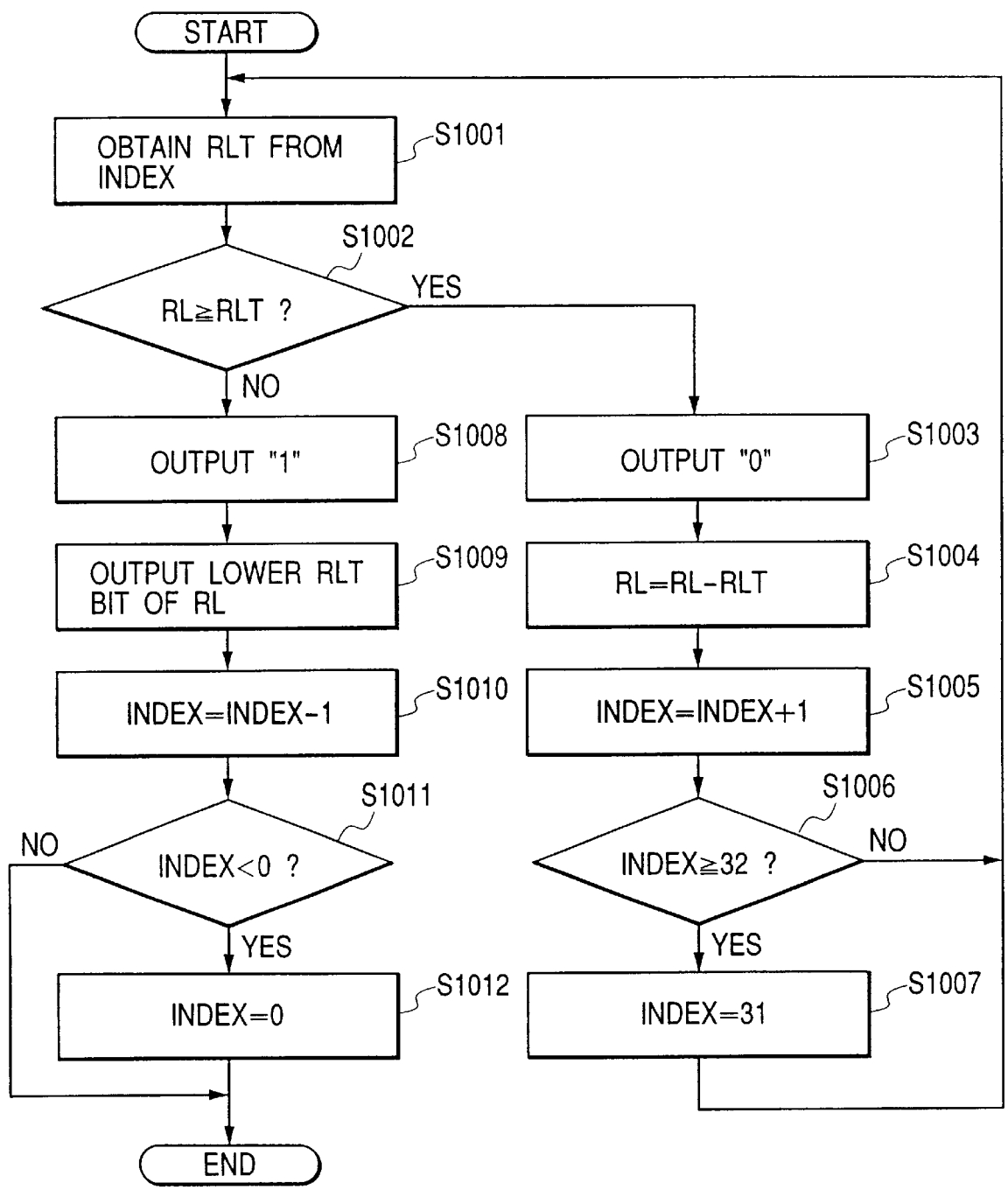
FIG. 10 is a flowchart showing the processing for Melcode coding.

Only when the coding control signal of "0" is received from the signal line 116, the Melcode encoding circuit 109 encodes the number RL of the continuous, same luminance values received from the signal line 117. FIG. 10 is a flowchart showing the Melcode encoding processing.

At STEP 1001 in FIG. 10, first, the run-length threshold value RLT is determined based on the index value (initial value at the beginning of encoding is 0) that is stored in the Melcode encoding circuit 109.

FIG. 11 is a diagram showing the index and the corresponding RLT. At STEP 1002, the value RLT is compared with the run length RL. When RL≧RLT, program control advances to STEP 1003, and when RL<RLT, program control goes to STEP 1008.

At STEP 1003, "0" is output as code, and at STEP 1004 the value RL is updated based on RL=RL−RLT. At STEP 1005, the index value is incremented, and when it is ascertained at STEP 1006 that the index value exceeds 31, at STEP 1007 a value of 31 is set for the index value, and program control thereafter returns to STEP 1001. When the index value does not exceed 31, program control returns to STEP 1001 without any process being performed.

When RL≧RLT, at STEP 1008 a value of "1" is output as code. At STEP 1009 the value RL is expressed in the binary system, and the lower RLT bit is output as code. At STEP 1010 the index value is decremented, and at STEP 1011 a check is performed to determine whether the index value is smaller than 0. When the index value is 0, at STEP 1012 a value of 0 is set to the index value, and the processing is thereafter terminated. When the index value is not smaller than 0, the processing is terminated without any processing being performed.

Through this process, the code for the run-length RL is generated and output.

The above described processing is repeated until the last pixel received from the input unit 100 is encoded. As a result, a series of code for the received image data can be output to the signal line 114.

Since the Melcode encoding method is disclosed in "Electronic Communication Institute Paper Magazine, 77/12 vol. J60-A, No. 12", no detailed explanation for it will be given.

The three encoding modes described above are employed in accordance with the encoding mode selection processing in FIG. 8.

According to the above encoding method, the lossless compression and encoding can be performed for color or monochrome multi-valued image data, without losing the amount of the data.

In this embodiment, the sign inversion process in FIG. 6 is performed for the lossless encoding. Therefore, while taking into account the characteristic of the entropy encoding, such as the Golomb-Rice coding, that the code length differs regardless of whether the prediction differences Diff have the same absolute value, whether the sign inversion is required for the prediction difference Diff before the entropy encoding can be determined depending on which of the positive sign and negative sign of the prediction difference Diff were produced more frequently before the preceding pixel of the object pixel is encoded. As a result, the prediction difference Diff that has the same absolute value and that is produced more frequency can be defined as a short code length, and efficient entropy coding can be performed.

The sign inversion process in this embodiment is characterized by being performed simply based on the number of occurrences, i.e., in accordance with which of the positive sign and the negative sign of the prediction difference Diff appeared more frequency before the preceding pixel of the object pixel is encoded. The inversion process in this embodiment is easier than the inversion method in accordance with whether the sum of the prediction differences Diff at the time where the preceding pixel m of the object pixel is encoded has a positive sign or a negative sign.

Furthermore, when a great positive or negative value is generated as the prediction difference Diff due to noise in an image, the optimal inversion process can not be preformed because the sum is biased toward either the positive or the negative side. In this embodiment, however, the affect from noise can be avoided.

The present invention is not limited to the above embodiment, and can be applied for a previous-sample prediction method to predict the value of a pixel to be encoded, or a plurality of prediction methods may be changed for use. Further, in this embodiment, the Golomb-Rice encoding and Molcode encoding are employed as the entropy encoding means; however, another entropy means may be employed as one part of these encoding means.

The sign inversion process in this embodiment is performed in the run-terminal mode. However, the present invention is not limited to this, and can be applied for the encoding process in the normal mode for performing entropy encoding for a specific predicted value, or for an independent encoding process. These modifications can also be included in the scope of the present invention.

(Second Embodiment)

A second embodiment of the present invention will now be described while referring to the accompanying drawings.

In this embodiment, monochrome image data of 8 bits each are encoded. It should be noted, however, that the coding performed by the present invention is not limited to data having this length, but can also be applied for a monochrome image wherein each pixel is represented by four bits, or a color, multi-valued image wherein each color component (RGB/Lab/YCrCb) of each pixel is represented by 8 bits. The present invention can also be applied for encoding multi-valued information wherein the state of each pixel constituting an image is represented; for example, for encoding a multi-valued index wherein the color of each pixel is represented. When the present invention is applied for the above encoding, only various types of multi-valued information need be encoded as monochrome image data, which will be described later.

Figure 14:
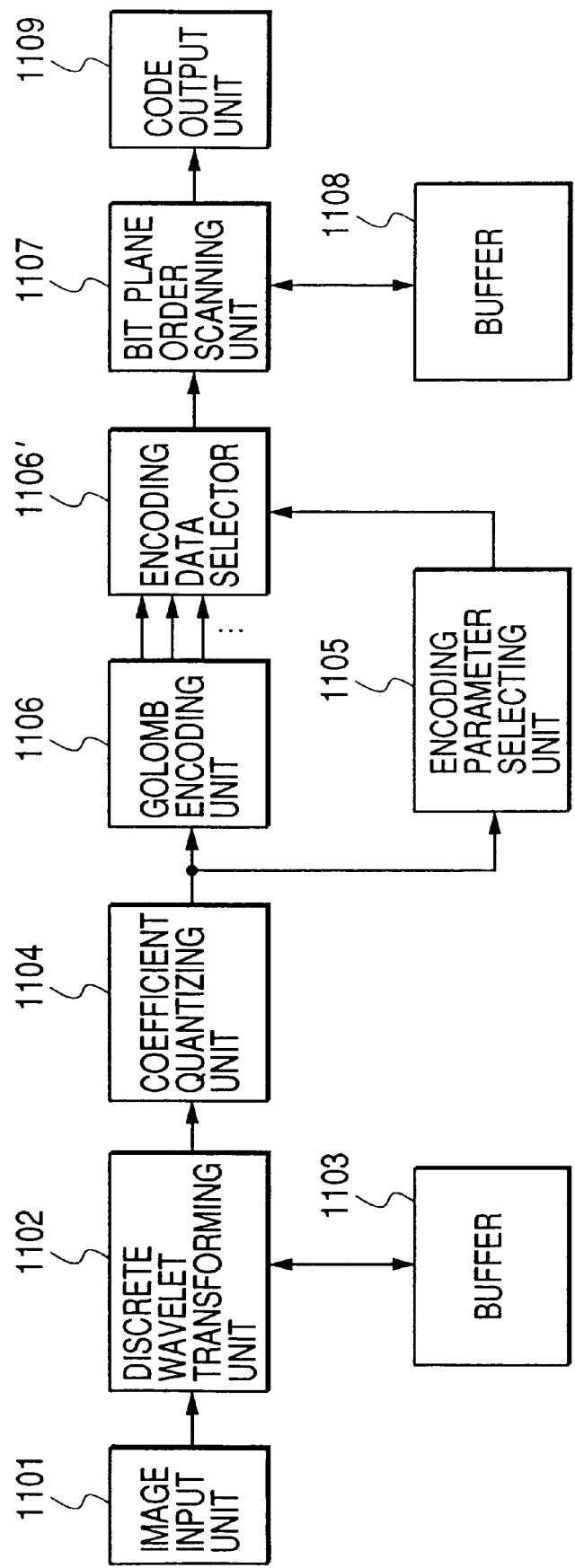
FIG. 14 is a diagram for a second embodiment of the present invention.

FIG. 14 is a block diagram illustrating an image processing apparatus for carrying out the second embodiment of the present invention. The image processing apparatus comprises: an image input unit 1101, a discrete wavelet transforming unit 1102, a buffer 1103, a coefficient quantizing unit 1104, an encoding parameter selecting unit 1105, a Golomb (Golomb-Rice) encoding unit 1106, a coded data selector 1106', a bit plane order scanning unit 1107, a buffer 1108 and a code output unit 1109.

First, image data that constitute an image to be encoded are obtained by the image input unit 1101 in the raster scan order. The image input unit 1101 is, for example, a photographing device, such as a scanner or a digital camera; an image pickup device, such as a CCD; or an interface for a network line. The image input unit 1101 may be a storage medium, such as a RAM, a ROM, a hard disk or a CD-ROM.

The discrete wavelet transforming unit 1102 receives pixel data for one screen from the image input unit 1101, and temporarily stores them in the buffer 1103. The discreet wavelet transforming unit 1102 then performs a well known discrete wavelet transform for the pixel data for one screen stored in the buffer 1103, and separates the data into a plurality of frequency bands. In this embodiment, the discrete wavelet transform for image data string x(n) is performed by using the following equation.

$$r(n)=\text{floor } \{x(2n)+x(2n+1))/2\}$$

$$d(n)=x(2n+2)-x(2n+3)+\text{floor } \{-r(n)+r(n+2)+2)/4\}$$

where r(n) and d(n) are transform coefficients: r(n) being a low frequency component, and d(n) being a high frequency component; and floor $\{X\}$ denotes a maximum integer that does not exceed X. While this transform equation is for one-dimensional data, a two-dimensional transform can be performed by applying this transform in the horizontal direction and in the vertical direction, in the named order. Therefore, the image data string can be divided into four frequency bands (sub-blocks) LL, HL, LH and HH, as shown in FIG. 15A.

When the discrete wavelet transform is performed in the same manner for the obtained LL component, the LL component is divided to obtain seven frequency bands (sub-blocks), as shown in FIG. 15B. In this embodiment, the discrete wavelet transform is repeated one more time for the seven frequency bands to obtain the 10 frequency bands (sub-blocks) LL, HL3, LH3, HH3, HL2, LH2, HH2, HL1, LH1 and HH1 shown in FIG. 15C.

The transform coefficient is output to the coefficient quantizing unit 1104 in the sub-block order, LL, HL3, LH3, HH3, HL2, LH2, HH2, HL1, LH1 and HH1, and in the raster scan order for each sub-block.

Figures 16, 17:
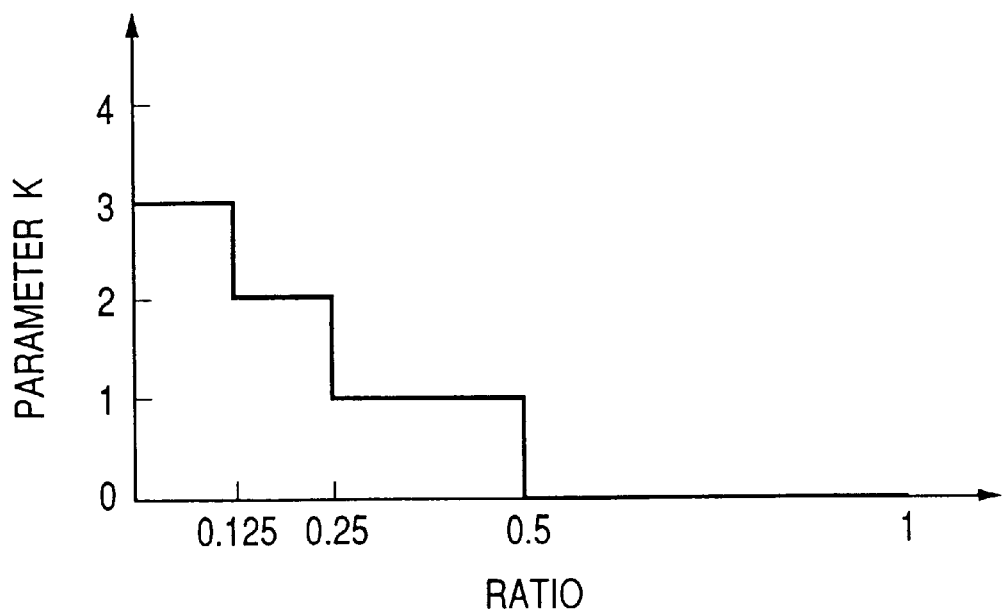
FIG. 16 is a diagram for explaining a quantizing step.
FIG. 17 is a graph for explaining the determination of a coding parameter for the second embodiment.

The coefficient quantizing unit 1104 receives the wavelet transform coefficients from the discrete wavelet transforming unit 1102, quantizes each coefficient at a quantizing step defined for each frequency component, and outputs the values obtained by quantization to the encoding parameter selecting unit 1105. When the coefficient value is X and the quantizing step for a frequency component to which this coefficient belongs is q, after quantization, coefficient value Q(X) is calculated using the following equation.

$$Q(X) = \text{floor}\{(X/q)+0.5\}$$

where floor{X} is a maximum integer that does not exceed X. FIG. 16 is a diagram showing the individual frequency components in this embodiment and corresponding quantizing steps. As is shown in FIG. 16, the quantizing step for a high frequency component (HL1, LH1 or HH1) is greater than is that for a low frequency component (LL, etc.).

Generally, the frequency whereat the quantized value are output by the coefficient quantizing unit 1104 differs in accordance with the contents of an image to be encoded. Thus, the method for preparing variable-length code must be changed as needed for efficient Golomb-Rice coding (variable-length coding).

In this embodiment, k types of frequency distributions are supposed that each represent gradual reduction (bias of the frequency toward the quantized value for which the frequency is highest) of the frequency from the code for which the frequency should be highest (Golomb-Rice code "1", "10" or "100" that corresponds to quantized value "0" in FIG., 19) to the code for which the frequency should be lowest (Golomb code that corresponds to a very great quantized value in FIG. 19). The k parameter is selected to generate variable-length code (Golomb-Rice code) that corresponds to each of the k types of frequency distributions. The k parameter for Golomb-Rice encoding is 0 when the bias of the frequency toward the quantized value that most frequently appeared is the greatest. As the bias is reduced, the value of the k parameter increased as 1, 2, . . .

Specifically, the encoding parameter selecting unit 1105 selects the k parameter based on a received quantizes value. The encoding parameter selecting unit 1105 counts, for each sub-block, the number of quantized values 0 from among those received from the coefficient quantizing unit 1104, and obtains the ratio R of the number of quantized values of 0 to the total quantized values in the pertinent sub-block.

Then, the encoding parameter selecting unit 1105 employs the obtained ratio R to calculate the k parameter as is shown in FIG. 17. When the ratio R is, for example 0.5 or greater, there are very many quantized value of 0 for which the frequency should be highest, and 0 is selected as the optimal k parameter. When the ratio R is equal to or grater than 0.25 and smaller than 0.5, 1 is selected as the optimal k parameter. In the same manner, a great value is selected as the k parameter in accordance with the reduction of the ratio R.

For a natural image appropriate for encoding in this embodiment, a reduction of the frequency (occurrence probability) from the most frequency produced quantized value toward the least frequently produced quantized value is larger for the conversion coefficient (e.g., HH1) of high frequency component than the conversion coefficient (e.g., HH3) of the low frequency component. That is, the bias of the frequency toward the most frequently produced quantized value tends to be increased. In addition to this, in this embodiment the conversion coefficient of the high frequency component is quantized more roughly than the conversion coefficient of the low frequency component. Thus, the reduction of the frequency from the most frequently produced quantized value toward the least frequently produced quantized value is more increased for the conversion coefficient of high frequency component than the conversion coefficient of the low frequency component. That is, the bias of the frequency toward the most frequently produced quantized value is more increased. In this embodiment, the two k parameters are set while taking these two matters into account.

As is described above, when the k parameter having a small value is set and the Golomb-Rice encoding is performed for a plurality of object values, the object values can be efficiently encoded when the reduction from the most frequently appeared value to the least frequently appeared value is large. When the k parameter having a great value is set and the Golomb-Rice encoding is performed for a plurality of object values, the object values can be efficiently encoded when the reduction from the most frequently appeared value to the least frequently appeared value is small.

FIG. 18 is a diagram showing frequency components (sub-blocks) obtained by the encoding parameter selecting unit 1105 and corresponding k parameters. This relationship differs in accordance with the contests of an image to be encoded. Since the k parameter is used to analyze all the quantized values in each sub-block, a little long processing time is required.

In this embodiment, for fast Golomb-Rice encoding, each available k parameter (e.g., k=0, 1, . . . or K−1) is employed to perform Golomb-Rice coding in advance for the individual quantized values for one sub-block to be processed, and the obtained Golomb-Rice coded data are stored.

Each time the k parameter that is to be actually employed is established (for each sub-block), the Golomb-Rice coded data are selected and output for one sub-block that corresponds to the k parameter. Then, the overall encoding can be fast performed.

An explanation will now be given for the processing for generating one set of Golomb-Rice coded data baaed on one k parameter.

Although the basic Golomb encoding method performed by the Golomb encoding unit 1106 in FIG. 14 is well known, a brief explanation will now be given only for the basic encoding operation and the characteristic portion of this invention.

First, the Golomb encoding unit 1106 determines whether each of the sequentially received quantized values is a positive value or a negative value, and outputs a sign (+ or −). Specifically, when the quantized value is 0 or positive, a value of "1" is output as a sign bit. When the quantized value is negative, a value of "0" is output.

Next, the Golomb-Rice encoding is performed for the absolute value of each quantized value. When the absolute value of a quantized value to be encoded is V and the parameter applied for a sub-block to be processed is k, the Golomb-Rice encoding is performed in the following manner. First, bit data representing V is shifted k bits to the right, and integer m is calculated. Based on the result, the Golomb-Rice code for V is composed of m "0"s, a "1" and the lower k bits.

FIG. 19 is a diagram showing example Golomb-Rice code when k=0, 1 and 2. As is apparent from FIG. 19, when the parameter k=0, in particular, the length of the Golomb-Rice code corresponding to the quantized value "0" is shorter than the length when the parameter k=1 or 2. Therefore, when a plurality of quantized values for which the ratio R for a quantized value of "0" is great are encoded, the coding efficiency is satisfactory.

The Golomb-Rice encoding and decoding can be performed without the code table being stored. When each variable-length code is hierarchically identified beginning from the most significant bit, the range for a decoded value that corresponds to the succeeding lower bit can be limited. Therefore, when the variable-length coded data is output hierarchically for each bit plane, the reception side can quickly and efficiently identify the outline of a decoded image.

In the above described manner, a sign (+ or −) bit for a received quantized value and a plurality of sets of Golomb-Rice coded data (e.g., K sets of k=0, 1, . . . and K−1) are generated, and output to the coded data selector 1106′.

Since the Golomb-Rice encoding unit 1106 must perform, in advance, the Golomb-Rice encoding by using a plurality of k parameters, Golomb-Rice encoding is performed for the same sub-block (each quantized value) by a plurality of times. To increase the processing speed, in this embodiment, the encoding apparatus is incorporated to perform parallel Golomb-Rice encoding for the same quantized value in accordance with a plurality of k parameters (e.g., k=0, 1, . . . and K−1).

When the k parameter appropriate for an object sub-block is received from the encoding parameter selecting unit 1105, the coded data selector 1106′ outputs corresponding Golomb-Rice coded data for one sub-block to the bit plane order scanning unit 1107.

The bit plane order scanning unit 1107 processes each of the frequency components (sub-blocks) described above. First, the bit plane order scanning unit 1107 receives data encoded by the Golomb-Rice encoding unit 1106, and stores the data for one frequency component (one of the sub-blocks LL to HH1) in the buffer 1108.

The code (+ or −) bit corresponding to each pixel generated by the Golomb-Rice encoding unit 1106 is stored in a positive/negative sign plane; the first bit (MSB) of the Golomb-Rice code that corresponds to each pixel is stored in the first bit plane; the second bit is stored in the second bit plane; and the third and the following bits are stored in the third and the following bit planes. In this manner, encoded data corresponding to the individual pixels are stored in the buffer 1108 as a plurality of bit planes.

When, for example, the data output by the Golomb-Rice encoding unit 1106 is "0110", "0" is stored in the positive/negative sign plane, "1" is stored in the first bit plane, "1" is stored in the second bit plane, and "0" is stored in the third bit plane. No bit information is stored in the fourth bit plane.

FIG. 20 is a diagram showing a table wherein a series, "3, 4, −2, −5, −4, 0, 1, . . . ", of coefficient data values (quantized values) quantized for the HL3 component are encoded using the Golomb-Rice encoding unit 1106, and the obtained data are stored as bit planes. In FIG. 20, shaded portions represent locations for which, since the entry of coded data is terminated in the upper planes, no bit information is required, i.e., wherein no bit information is entered. The bit plane order scanning unit 1107 receives from the Golomb-Rice encoding unit 1106 all the code data representing one frequency component (one of the sub-blocks LL to HH1), and stores the data in the buffer 108, as described above. Then, the bit plane order scanning unit 1107 reads the information from the bit planes in the raster scanning order and in the order represented by the sign bit plane, the first bit plane and the second bit plane, i.e., in the order beginning with the sign bit plane and continuing down to the lowest bit plane, and outputs it to the code output unit 1109. FIG. 21 is a diagram showing the format of the bit information that is extracted from the buffer 1108 and output in the bit plane order.

The data are output hierarchically for each bit plane in the order of the sub-blocks for the low frequency components, LL, HL3, LH3, HH3, HL2, LH2, HH2, HL1, LH1 and HH1.

The code output unit 1109 hierarchically outputs the obtained plurality of bit plane data sets. An interface for a public telephone network, a radio network or a LAN can be employed as the code output unit 1109. The code output unit 1109 may also be a storage device, such as a hard disk, a RAM or DVD, for storing the hierarchial data.

Since the images are hierarchically transmitted in order from the low frequency component to the high frequency component, the reception side can obtain the outline of an image hierarchically. Further, since data for the individual frequency components are also transmitted hierarchically for each bit plane, the reception side can also obtain the outline of each frequency component hierarchically. In addition, since each pixel (transform coefficient) is expressed by using a variable data length, the total amount of code can be reduced compared with the amount obtained when normal encoding is used for each bit plane.

It should be noted that information required by the decoding side, such as the image size, the bit count for each pixel, the quantizing step for each frequency component or the parameter k, is added as needed to the encoded data in the embodiment. For example, for the image processing for each line, for each block or for each band, information indicating the size of image is required.

(Third Embodiment)

In the second embodiment, the ratio of quantized values of 0 to the total quantized values is employed to estimate the k parameter. Another method may be employed to select an appropriate k parameter. In a third embodiment, a method for obtaining a k parameter from a statistic distribution of quantized values will be explained. The overall arrangement of an encoding apparatus in this embodiment is the same as that in the second embodiment, and only the operation by the encoding parameter selecting unit 1105 in FIG. 14 differs.

First, image data are received via the image input unit 1101 in the same manner as in the second embodiment, and are temporarily stored in the buffer 1103. The discrete wavelet transform is performed for the image data by the discrete wavelet transforming unit 1102, and are divided into a plurality of frequency bands (sub-blocks) shown in FIGS. 15A to 15C.

The conversion coefficient included in each sub-block is quantized at a predetermined quantizing step q by the coefficient quantizing unit 1104, and the result is transmitted to the encoding parameter selecting unit 1105.

Figure 22A:
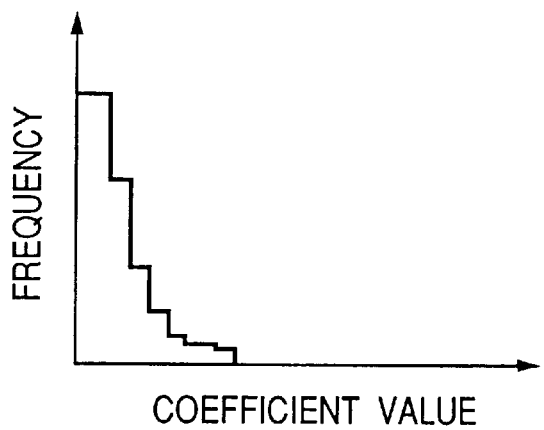
FIGS. 22A and 22B are a graph and a flowchart for explaining the determination of a coding parameter for a third embodiment.

The operation performed by the encoding parameter selecting unit 1105 will now be described while referring to FIGS. 22A and 22B.

First, the encoding parameter selecting unit 1105 generates a histogram for quantized values in a received sub-block. FIG. 22A is a diagram showing an example histogram generated by the encoding parameter selecting unit 1105. The histogram is for coefficient values (quantized values) that constitute a sub-block at a high frequency band, such as HL3 or LH3. A great peak is present at the coefficient value (quantized value) of 0, and the frequency is drastically reduced therefrom. The encoding parameter selecting unit 1101 employs this histogram to select a k parameter in accordance with the procedures in the flowchart in FIG. 22B.

Figure 22B:
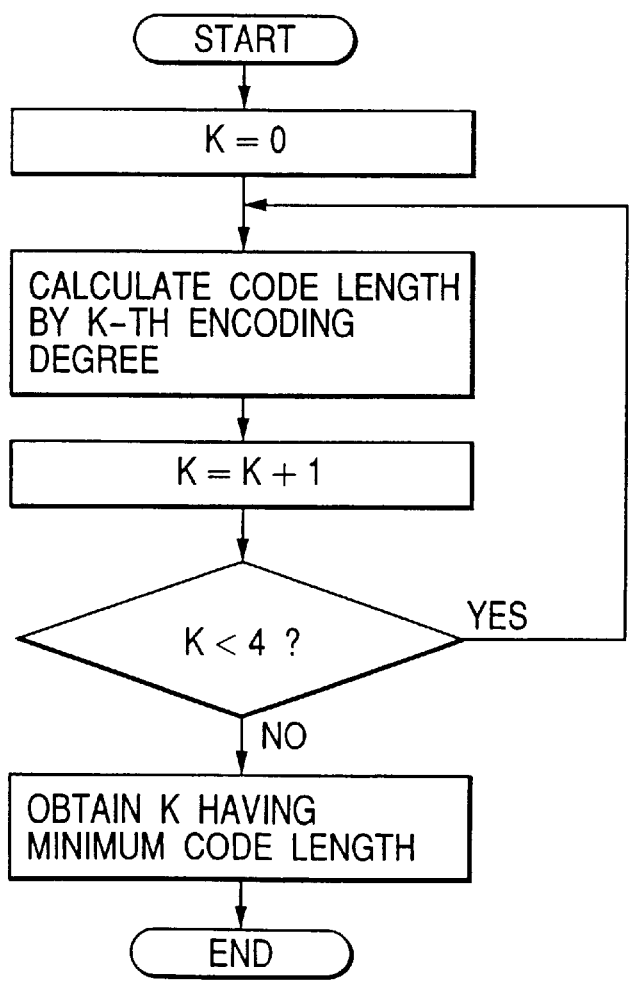

In FIG. 22B, fist, 0 is selected as the initial value of a value K(i) proposed for the k parameter. Then, code length L(i) when the K(i) is selected by using the value K(i) and the histogram is calculated by using the following equations.

$$L(i) = \sum_{q=0}^{q \leq Q\max} (((q >> K(i)) + 1 + K(i)) * H(q))$$

In the equations, q denotes a quantized value; Qmax denotes the maximum quantized value that is determined in advance; H(q) denotes a frequency for the quantized value q obtained from the histogram; >> denotes a right shift operator; and q>>K(i) denotes a shift of q to the right by K(i) bits. The encoding parameter selecting unit 1105 then increments K(i) by one. When the resultant K(i) is smaller than a predetermined number (4 in this embodiment), the code length L(i) for the current proposed value K(i) is calculated again by using the above equations, and is stored. When the value K(i) is equal to or greater than 4, the encoding parameter selecting unit 1105 obtains the minimum value L(i), and outputs the pertinent proposed value K(i) as a quantizing k parameter.

Since the succeeding processing is the same as that for the first embodiment, no further explanation will be given. As is described above, since the k parameter for which the code length is minimum is selected for each input sub-block, high-efficiency coding for the entire image can be implemented.

(Fourth Embodiment)

In the third embodiment, the k parameter is obtained by using the histogram of quantized values. In order to prepare a histogram, all the data in a sub-block must be read once. In a fourth embodiment, an explanation will be given for a method for employing the maximum quantized value in a sub-block, without a histogram being required.

Since the arrangement in this embodiment as well as in the third embodiment is the same as that for the second embodiment, except for the encoding parameter selecting unit 1105, only an explanation for the selecting unit 1105 will be given. In this embodiment, the encoding parameter selecting unit 1105 receives the quantized values from the coefficient quantizing unit 1104, and obtains the maximum quantized value for each sub-block. The encoding parameter selecting unit 1105 selects the k parameter based on the obtained maximum value and the relationship that is established in advance by a predetermined method between the appropriate k parameter and the maximum value.

Figure 23:
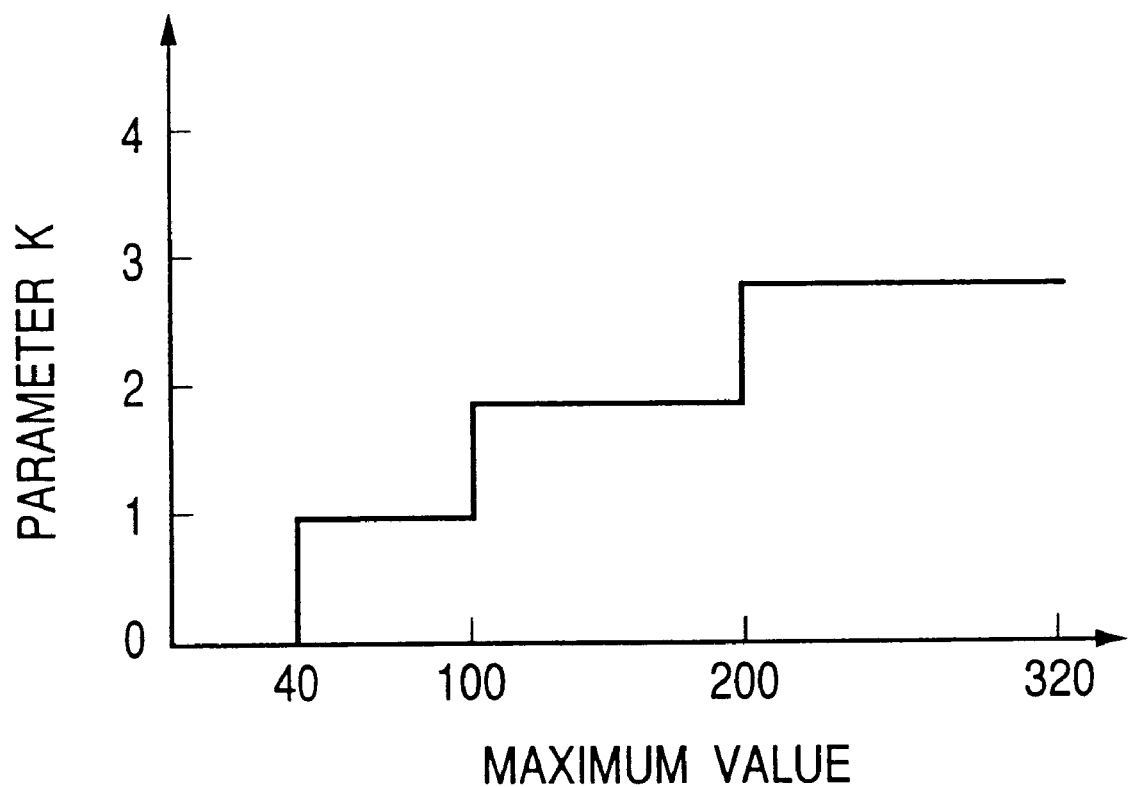
FIG. 23 is a graph for explaining the determination of a coding parameter for a fourth embodiment.

FIG. 23 is a graph showing an example relationship between the maximum quantized value and the k parameter. In this example, 0 is selected as the k parameter value when the maximum quantized value in a sub-block is equal to or greater than 0 and smaller than 40, and 1 is selected when the maximum quantized value is equal to or greater than 40 and smaller than 100. This relationship can be provided by using a lookup table.

Generally, the distribution of the coefficient values or the quantized values that are obtained by performing discrete wavelet transform for an image is close to being the Laplace distribution. Therefore, when a relationship between the maximum quantized value and the optimal k parameter is examined in advance by using several images, the k parameter can be estimated by employing the maximum quantized value.

It should be noted that information required by the decoding side, such as the image size, the bit count for each pixel, the quantizing step for each frequency component or the parameter k, is added as needed to the encoded data in the individual embodiments. For example, for the image processing for each line, for each block or for each band, information indicating the size of image is required.

(Other Embodiment)

In the above embodiments, the bit information for each bit plane is output unchanged. The present invention is, however, not limited to these embodiments. Instead of outputting the bit information unchanged to the code output unit, high-efficiency coding can be performed for the bit information that is finally output in the first embodiment, so that the total amount of code can be reduced. Run length coding or arithmetic coding can be employed as the high-efficiency coding, and higher-efficiency coding can be implemented. In the above embodiment, coding performed by using the discrete wavelet transform for an input image is employed. The present invention is not limited to the discrete wavelet transform used for these embodiments, and a different filter type or a different frequency division method may be employed. Furthermore, the present invention may be applied for encoding based on a transforming method, such as the DCT transform (discrete cosine transform), in addition to the discrete wavelet transform.

The method used for quantizing the frequency component or the variable length coding method is not limited to that used for the embodiments. For example, one frequency component (sub-block) can be sorted to several classes by identifying the local property of each block, and the quantizing step and the encoding parameter may be designated for each class.

(Modification)

The present invention may be applied as one part of a system that is constituted by a plurality of apparatuses (e.g., a host computer, an interface device, a reader and a printer), or as a part of an apparatus (e.g., a copier or a facsimile machine).

Further, the present invention is not limited to the apparatuses or the methods used to implement the above embodiments, but can also include a case where software program code for implementing the previous embodiments is supplied to a computer (or a CPU or an MPU) in an apparatus or in a system, and in consonance with the program, the computer in the system or in the apparatus can operate various devices to accomplish the above embodiments.

In this case, the program code read from the storage medium performs the functions assigned to the embodiments, and the program code and the means for supplying the program code to the computer, specifically, the storage medium on which such program code is recorded, constitutes the present invention.

A storage medium for supplying such program code can be, for example, a floppy disk, a hard disk, an optical disk, a magneto-optical disk, a CD-ROM, a magnetic tape, a nonvolatile memory card or a ROM.

In addition, the present invention includes not only the case where the functions in the previous embodiments can be performed by the computer reading and executing program code, but also the case where, in accordance with an instruction in the program code, an OS (Operating System) running on the computer performs part, or all, of the actual processing.

Furthermore, the present invention includes a case where program code, read from a storage medium, is written in a memory that is mounted on a function expansion board inserted into a computer, or inserted into a function expansion unit connected to a computer, and in consonance with a program code instruction, a CPU mounted on the function expansion board, or in the function expansion unit, performs part, or all, of the actual processing in order to implement the functions included in the above described embodiments.

As is described above, according to the above described embodiments, before k parameters required for Golomb-Rice coding are produced, Golomb-Rice coded data that correspond to the k parameters are stored in advance, and when the k parameter is determined, the corresponding coded data are immediately selected and output. Therefore, the overall encoding speed can be increased.

As is described above, according to the present invention, the Golomb-Rice encoding speed is increased, and accordingly, the entire encoding speed is improved.

The present invention can be variously modified within the scope of the following claims.

What is claimed is:

1. An encoding apparatus comprising:

input means for inputting image data for each predetermined unit of data;

generation means for performing Golomb-Rice coding for the image data for each predetermined unit using each of K types of k parameters in parallel to obtain K types of Golomb-Rice coded data at high speed, and for generating a plurality of Golomb-Rice coded data respectively corresponding to K types of k parameters for each predetermined unit of data to be coded;

holding means for holding the plurality of Golomb-Rice coded data obtained by said generation means; and determination means for, based on the image data, determining one of the k parameters for each predetermined unit of data, wherein said holding means selects and outputs one of the plurality of Golomb-Rice coded data by employing the determined k parameter, without outputting the other coded data.

2. An encoding apparatus according to claim 1, wherein the predetermined unit is one pixel.

3. An encoding apparatus according to claim 1, wherein the image data inputted from said input means is a difference value from a predicted value of the image data.

4. An encoding apparatus according to claim 1, wherein said apparatus is operable both in a first encoding mode, in which said input means, said generation means, said holding means and said determination means perform encoding, and in a second encoding mode, in which run-length encoding is performed for the image data.

5. An encoding apparatus according to claim 1, wherein the image data is a coefficient that is constituted by a plurality of sub-blocks obtained by wavelet transform, and the predetermined unit corresponds to one of the plurality of sub-blocks.

6. An encoding apparatus according to claim 5, wherein the image data is a quantized value obtained by quantizing the coefficient.

7. An encoding apparatus according to claim 1, further comprising:

bit plane encoding means for encoding, for each bit plane, Golomb-Rice coded data output from said holding means.

8. An encoding method comprising:

an input step, of inputting image data for each predetermined unit of data;

a generation step, of performing Golomb-Rice coding for the image data for each predetermined unit using each of K types of k parameters in parallel to obtain K types of Golomb-Rice coded data at high speed, and of generating a plurality of Golomb-Rice coded data respectively corresponding to K types of k parameters for each predetermined unit of data to be coded;

a holding step, of holding the plurality of Golomb-Rice coded data obtained in said generation step;

a determination step, of, based on the image data, determining one of the k parameters for each predetermined unit of data; and a selection step, of selecting and outputting one of the plurality of Golomb-Rice coded data by employing the k parameter determined in said determination step, without outputting the other coded data.

9. A storage medium on which an encoding program is stored, said encoding program comprising:

an input step, of inputting image data for each predetermined unit of data;

a generation step, of performing Golomb-Rice coding for the image data for each predetermined unit using each of K types of k parameters in parallel to obtain K types of Golomb-Rice coded data at high speed, and of generating a plurality of Golomb-Rice coded data respectively corresponding to K types of k parameters for each predetermined unit to be coded;

a holding step, of holding the plurality of Golomb-Rice coded data obtained in said generation step;

a determination step, of, based on the image data, determining one of the k parameters for each predetermined unit of data; and a selection step, of selecting and outputting one of the plurality of Golomb-Rice coded data by employing the k parameter determined in said determination step, without outputting the other coded data.

* * * * *

UNITED STATES PATENT AND TRADEMARK OFFICE
CERTIFICATE OF CORRECTION

PATENT NO.      : 6,711,295 B2
APPLICATION NO. : 09/412431
DATED           : March 23, 2004
INVENTOR(S)     : Tadayoshi Nakayama et al.

It is certified that error appears in the above-identified patent and that said Letters Patent is hereby corrected as shown below:

<u>COLUMN 4</u>

Line 15, "not" should read --is not--.

<u>COLUMN 6</u>

Line 26, "0128," should read --128,--.

<u>COLUMN 7</u>

Line 48, "correspond" should read --corresponds--.

<u>COLUMN 8</u>

Line 21, "when" should read --When--.

<u>COLUMN 10</u>

Line 34, "is" (second occurrence) should be deleted.

<u>COLUMN 11</u>

Line 35, "frequency" should read --frequently--; and
    Line 43, "preformed" should read --performed--.

<u>COLUMN 13</u>

Line 27, "Fig., 19)" should read --Fig. 19)--;
    Line 36, "quantizes" should read --quantized--;
    Line 45, "value" should read --values--;
    Line 47, "grater" should read --greater--; and
    Line 54, "frequency" should read --frequently--.

<u>COLUMN 14</u>

Line 21, "contests" should read --contents--; and
    Line 36, "baaed" should read --based--.

UNITED STATES PATENT AND TRADEMARK OFFICE
CERTIFICATE OF CORRECTION

PATENT NO. : 6,711,295 B2
APPLICATION NO. : 09/412431
DATED : March 23, 2004
INVENTOR(S) : Tadayoshi Nakayama et al.

It is certified that error appears in the above-identified patent and that said Letters Patent is hereby corrected as shown below:

COLUMN 16

Line 57, "fist," should read --first,--.

Signed and Sealed this

First Day of July, 2008

JON W. DUDAS
*Director of the United States Patent and Trademark Office*